US008023354B2

(12) United States Patent
Jeong

(10) Patent No.: US 8,023,354 B2
(45) Date of Patent: Sep. 20, 2011

(54) SEMICONDUCTOR MEMORY DEVICE INCLUDING A FUSE SET AND A CURRENT CONTROLLING UNIT

(75) Inventor: Young-Han Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 139 days.

(21) Appl. No.: 12/486,784

(22) Filed: Jun. 18, 2009

(65) Prior Publication Data
US 2010/0165766 A1 Jul. 1, 2010

(30) Foreign Application Priority Data

Dec. 30, 2008 (KR) .................. 10-2008-0137385

(51) Int. Cl.
*G11C 17/18* (2006.01)
*G11C 7/00* (2006.01)
*G11C 17/00* (2006.01)

(52) U.S. Cl. .................. 365/225.7; 365/96; 365/200
(58) Field of Classification Search ............ 365/225.7
See application file for complete search history.

(56) References Cited

U.S. PATENT DOCUMENTS

| 5,548,557 | A | * | 8/1996 | Futatsuya et al. ............. 365/201 |
| 5,574,689 | A | * | 11/1996 | Morgan ............ 365/200 |
| 5,640,365 | A | * | 6/1997 | Imamiya et al. ............. 365/236 |
| 5,677,882 | A | * | 10/1997 | Isa et al. ............. 365/200 |
| 5,703,824 | A | * | 12/1997 | Isa ............. 365/225.7 |
| 5,768,197 | A | * | 6/1998 | Choi ............. 365/200 |
| 5,862,087 | A | * | 1/1999 | Lee ............. 365/200 |
| 5,933,382 | A | * | 8/1999 | Yi et al. ............. 365/225.7 |
| 5,959,904 | A | * | 9/1999 | Oh ............. 365/200 |
| 6,118,712 | A | * | 9/2000 | Park et al. ............. 365/200 |
| 7,173,867 | B2 | | 2/2007 | Terzioglu |
| 7,257,037 | B2 | | 8/2007 | Kang |
| 7,391,660 | B2 | * | 6/2008 | Koo ............. 365/200 |
| 7,495,977 | B1 | | 2/2009 | Moscaluk |
| 2005/0254321 | A1 | * | 11/2005 | Okuyama et al. ............. 365/200 |
| 2009/0027980 | A1 | | 1/2009 | Kobayashi |

FOREIGN PATENT DOCUMENTS

| JP | 2006-172335 | 6/2006 |
| KR | 1020080014369 | 2/2008 |

OTHER PUBLICATIONS

Notice of Preliminary Rejection issued from Korean Intellectual Property Office on Oct. 12, 2010.

* cited by examiner

*Primary Examiner* — Son L Mai
(74) *Attorney, Agent, or Firm* — IP & T Group LLC

(57) ABSTRACT

A semiconductor memory device includes a fuse set configured to form a current path including at least one of a plurality of fuses in response to address information corresponding to a plurality of memory cells and to output a redundancy address corresponding to a programming state of the plurality of fuses where the plurality of fuses are programmed with address information corresponding to a target memory cell to be repaired among the plurality of memory cells, and at least one current controlling unit configured to control a driving current flowing through the current path according to at least one detection signal.

13 Claims, 4 Drawing Sheets

… (1)

SEMICONDUCTOR MEMORY DEVICE INCLUDING A FUSE SET AND A CURRENT CONTROLLING UNIT

CROSS-REFERENCE TO RELATED APPLICATIONS

The present invention claims priority of Korean patent application number 10-2008-0137385, filed on Dec. 30, 2008, the disclosure of which is incorporated by reference herein in its entirety.

BACKGROUND OF THE INVENTION

The present invention relates to a semiconductor design technology, and more particularly, to a fuse set for outputting a redundancy address corresponding to accessing a target memory cell to be repaired.

An integration level of a semiconductor memory device has increased incredibly. Thus, a semiconductor memory device such as a Double Data Rate Synchronous DRAM (DDR SDRAM) includes more than thousands of memory cells. If one of the memory cells fails, a semiconductor memory device thereof cannot perform a desired operation. In probability, a very small number of memory cells fail due to advanced manufacturing technology of a semiconductor memory device. However, even if a semiconductor memory device includes a very small number of failed memory cells, the semiconductor memory device may be dismissed as a defective product. This is unacceptable in terms of product yields. In order to overcome the problem, a semiconductor memory device includes not only a normal memory cell but also a redundancy memory cell. If a normal memory cell fails, it is replaced with one of redundancy memory cells. Hereinafter, a failed normal memory cell that should be replaced with one of redundancy memory cells is referred to as a target memory cell to be repaired.

Meanwhile, a semiconductor memory device includes a fuse set for programming an address corresponding to a target memory cell to be repaired. Here, the programming is a set of processes for storing an address in a fuse set corresponding to a target memory cell to be repaired. The fuse set outputs a programmed address as a redundancy address. Therefore, in case of accessing a target memory cell to be repaired, a semiconductor memory device compares an address inputted corresponding to the target memory cell to be repaired with a redundancy address outputted from a fuse set and redirects it to the redundancy memory cell instead of the target memory cell to be repaired.

An electric cutting-off method and a laser cutting method were used to program a plurality of fuses. Here, the electric cutting method cuts off a target fuse by applying excessive current to and melting down the target fuse. The laser cutting-off method cuts off a target fuse by blowing the target fuse using a laser beam. In general, the electric cutting-off method was widely used because the electric cutting-off method is simpler than the laser cutting-off method.

FIG. 1 is a block diagram illustrating a conventional semiconductor memory device.

Referring to FIG. 1, the conventional semiconductor memory device includes a memory bank 110, a column decoder 130, and a plurality of fuse sets 150.

The memory bank 110 includes first to $n^{th}$ memory cell arrays each of which is a group of a plurality of memory cells where n is a natural number. Each of the first to $n^{th}$ memory cell arrays 111, 112, and 113 includes a normal memory cell array and a redundancy memory cell array. The column decoder 130 decodes a column address applied from an external device and selects a corresponding memory cell based on the decoded column address. The fuse set 150 outputs a column address programmed corresponding to a target memory cell to be repaired as a redundancy address.

Hereinafter, an operation of a conventional semiconductor memory device when a target memory cell to be repaired is accessed will be described.

The semiconductor memory device activates a corresponding word line by decoding a row address. Then, a plurality of fuse sets 150 output address information programmed in response to a cell array activation signal MATY<1:n> (see FIG. 2), which is memory cell array information including the activated word line, as a redundancy address YRA<3:9> (see FIG. 2). The column decoder 130 outputs a selection signal to access a redundancy memory cell by comparing an address inputted corresponding to a target memory cell to be repaired with the redundancy address YRA<3:9>. Such a sequence of processes guarantees the semiconductor memory device to access a redundancy memory cell that normally operates when the semiconductor memory device performs a read operation and a write operation.

FIG. 2 is a circuit diagram illustrating a plurality of fuse sets 150 shown in FIG. 1. For convenience in description, a fuse set outputting a third redundancy address YRA<3> will be described as an example among a plurality of fuse sets.

Referring to FIG. 2, the fuse set includes a plurality of fuses 210, a plurality of selectors 230, a latch unit 250, a precharging unit 270, and an output unit 290.

The plurality of fuses 210 program address information corresponding to a target memory cell to be repaired. The plurality of fuses 210 include a node A and a first fuse to an $n^{th}$ fuse F1, F2, ..., Fn connected to a plurality of selectors 230, respectively.

The plurality of selectors 230 include a first NMOS transistor to an $n^{th}$ NMOS transistor N1, N2, ..., and Nn which form a source-drain path between the first to $n^{th}$ fuses F1, F2, ..., and Fn and a ground supply voltage (VSS) terminal and have a gate receiving first to $n^{th}$ cell array activation signals MATY<1:n>. Here, the first to $n^{th}$ cell array activation signals MATY<1:n> are signals corresponding to a memory cell array including an activated word line among the first to the $N^{th}$ memory cell arrays 111, 112, and 113 (see FIG. 1).

The latch unit 250 latches a logical level value according to a programming state of a selected fuse in response to the first to $n^{th}$ cell array activation signals MATY<1:n> among a plurality of fuses 210. The latch unit 250 includes a first inverter INV1 and a second inverter INV2.

The precharging unit 270 initializes the latch unit 250. The precharging unit 270 includes a first PMOS transistor P1 forming a source-drain path between an external supply voltage VDD terminal and a node A which is an input terminal of the latch unit 250 and a gate for receiving a reset signal RST. The reset signal RST is a signal transiting from a logical 'low' to logical 'high' when a semiconductor memory device is activated. The first PMOS transistor P1 is turned on before activating the semiconductor memory device and drives the nose A with external supply voltage VDD. The reset signal RST will be described again with reference to FIG. 3.

The output unit 290 receives an output signal of the latch unit 250 and outputs a third redundancy address YRA<3>. The output unit 290 includes a third inverter INV3 for receiving an output signal of the latch unit 250.

Meanwhile, each of the plurality of fuse sets 150 has the same structure described above and outputs a corresponding redundancy address. That is, a plurality of fuse sets 150 output programmed addresses as third to ninth redundancy addresses YRA<3:9> in response to the first to $n^{th}$ cell array activation signals MATY<1:n>. The semiconductor memory device performs an access operation of a redundancy memory cell using the outputted third to ninth redundancy addresses YRA<3:9>.

FIG. 3 is a timing diagram describing a circuit operation of a plurality of fuse sets 150 of FIG. 2. For convenience in description, a fuse set outputting a third redundancy address YRA<3> will be described as an example among the plurality of fuse sets 150. Also, the first fuse F1 will be exemplarily described among a plurality of fuses 210. That is, circuit operations when the first fuse F1 is cut off and when the first fuse F1 is not cut off will be described.

At first, a circuit operation when the first fuse F1 is cut off will be described.

Referring to FIGS. 2 and 3, the reset signal RST transits from logical 'high' to logical 'low' in response to a precharging command PRC. Therefore, the first PMOS transistor PM1 is turned on and the node A is driven with an external supply voltage VDD. Accordingly, the latch unit 250 is initialized to logical 'high'. Then, when the active command ACT is applied, the reset signal RST transits from logical 'low' to logical 'high'. The first PMOS transistor P1 is turned off, and the node A sustains logical 'high' by the second inverter INV2 of the latch unit 250. Meanwhile, the first cell array activation signal MATY<1> is activated from logical 'low' to logical 'high' in response to the active command ACT. Here, although the first NMOS transistor N1 is turned on, the node A sustains logical 'high' because the first fuse F1 is cut off.

Hereinafter, a circuit operation when the first fuse F1 is not cut off will be described. The circuit operation before the active command ACT will be omitted because it is identical to that when the first fuse F1 is cut off. The first cell array activation signal MATY<1> is activated from logical 'low' to logical 'high' in response to the active command ACT. The first NMOS transistor N1 is turned on and the node A transits from logical 'high' to logical 'low' because the first fuse F1 is not cut off.

FIG. 3 is a timing diagram illustrating operations when a fuse set normally operates. As shown, a logical level of a third redundancy address YRA<3> is decided according to whether the first fuse F1 is cut off or not. That is, the third redundancy address YRA<3> becomes logical 'high' when the first fuse F1 is cut off and the third redundancy address YRA<3> becomes logical 'low' when the first fuse F1 is not cut off. The third redundancy address YRA<3> is compared with an address applied corresponding to a read command RD and a semiconductor memory device decide whether or not to access a redundancy memory cell according to the comparison result.

Meanwhile, when the first fuse F1 is cut off, a current path if formed between the node A and an external supply voltage VDD terminal by the second PMOS transistor P2 of the second inverter INV2. The formed current path is referred to as a pull-up current path. That is, the node A sustains logical 'high' because the node A is driven with a pull-up driving current I_PU flowing through the pull-up current path. When the first fuse F1 is not cut off, a current path (hereinafter pull-down current path) is formed between the node A and the ground supply voltage VSS terminal as well as the pull-up current path. That is, the node A is driven by current generated oppositely by the pull-up driving current I_PU and a pull-down driving current I_PD flowing through the pull-down current path. In ideal case, the node A transits to logical 'low' because the pull-down driving current I_PD is greater than the pull-up driving current I_PU.

Meanwhile, according to the development of a fabrication technology of a semiconductor memory device, a very small scale design-rule such as a sub-micron level design-rule has been applied to design an internal circuit of a semiconductor memory device. Since a semiconductor memory device is densely integrated based on the sub-micron level design-rule, a typical chip has been decreasing in size rapidly. However, since such sub-micron level circuitry elements vary in properties according to manufacturing process characteristics, a supply voltage, and temperature variation, related problems have occurred.

FIG. 4 is a timing diagram illustrating malfunctioning of a plurality of fuse sets 150 of FIG. 2. For ease of description, signals identical to those shown in FIG. 3 will be described.

Referring to FIGS. 2 to 4, operation states of a semiconductor memory device vary according to the manufacturing process characteristics, supply voltage, and temperature variation. Accordingly, the pull-up driving current I_PU and the pull-down driving current I_PD may be changed. In other word, if the first cell array activation signal MATY<1> is activated without cutting off the first fuse F1, the node A of FIG. 3 is driven by a ground supply voltage VSS according to an increase of the pull-down driving current I_PD. However, in FIG. 4, the node A is not driven by the ground supply voltage VSS because the pull-down driving current I_PD does not become sufficiently greater than the pull-up driving current I_PU or because the pull-up driving current I_PU become excessively large. That is, a voltage level of the node A becomes vague. Finally, the vague voltage level of the node A makes an incorrect third redundancy address YRA<3> to output according to a threshold voltage of the first inverter INV1. Such an incorrect third redundancy address YRA<3> causes a problem of misreading an address corresponding to a normal memory cell as a target memory cell to be repaired or misreading an address corresponding to a target memory cell to be repaired as a normal memory cell.

As described above, a plurality of fuse sets 150 (see FIG. 1) form a pull-up driving path and a pull-down driving path including a corresponding fuse according to $0^{th}$ to $n^{th}$ cell array activation signals MATY<1:n> and generate third to ninth redundancy addresses YRA<3:9> through the pull-up driving current I_PU and the pull-down driving current I_PD. However, the operation state changes according to variation of a manufacturing process, a supply voltage, and a temperature due to down-sized elements according to the development of a manufacturing technology. Such variation of the operation state becomes a critical factor to change the pull-up driving current I_PU and the pull-down driving current I_PU. The changed pull-up driving current I_PU and pull-down driving current I_PD make a plurality of fuse sets 150 to output incorrect third to ninth redundancy addresses YPA<3:9>.

The number of memory banks has increased in order to satisfy a demand of a user such as a mass capacity semiconductor memory device. If a semiconductor memory device has a plurality of fuse sets corresponding each of memory banks as shown in FIG. 1, the number of the fuse sets increases in proportion to the increment of the memory banks. That is, power consumption of the semiconductor memory device increases corresponding to the increment of the fuse sets.

SUMMARY OF THE INVENTION

Embodiments of the present invention are directed to providing a semiconductor memory device for controlling a driving current of a current path including fuses according to manufacturing characteristics, a supply voltage, and temperature variation.

Embodiments of the present invention are also directed to providing a semiconductor memory device for selectively activating a plurality of fuse sets included corresponding to each memory bank.

In accordance with an aspect of the present invention, there is provided a semiconductor memory device including a fuse set configured to form a current path including at least one of a plurality of fuses in response to address information corresponding to a plurality of memory cells and to output a redundancy address corresponding to a programming state of the plurality of fuses where the plurality of fuses are programmed with address information corresponding to a target memory cell to be repaired among the plurality of memory cells, and at least one current controlling unit configured to control a driving current flowing through the current path according to at least one detection signal.

In accordance with another aspect of the present invention, there is provided a semiconductor memory device including a plurality of fuse sets configured to output a plurality of redundancy addresses according to a programming state of a plurality of fuses in response to address information corresponding to a plurality of memory cells in each memory bank and corresponding to a plurality of memory banks where the plurality of fuses are programmed with address information corresponding to a target memory cell to be repaired among the plurality of memory cells, and at least one activation controlling unit configured to control activation of the plurality of fuse sets in response to a selection signal corresponding to the memory bank.

In accordance with another aspect of the present invention, there is provided a method, which includes forming a current path including at least one of a plurality of fuses in response to address information corresponding to a plurality of memory cells, outputting a redundancy address corresponding to a programming state of the plurality of fuses where the plurality of fuses are programmed with address information corresponding to a target memory cell to be repaired among the plurality of memory cells, and selectively turning on a plurality of transistors connected to the current path to drain current through the current path, wherein a number of the transistors that are turned on changes based on at least one detection signal.

The semiconductor memory device according to the present invention controls a driving current flowing through a current path of a plurality of fuses according to manufacturing process characteristics, a supply voltage, and temperature variation and outputs a predetermined redundancy address according to a programming state of a fuse using the controlled driving current. Therefore, the reliability of the semiconductor memory device may be improved. Also, the semiconductor memory device according to the present invention effectively consumes electric power by activating a plurality of fuse sets in each of memory banks according to a memory bank.

DESCRIPTION OF SPECIFIC EMBODIMENTS

Other objects and advantages of the present invention can be understood by the following description, and become apparent with reference to the embodiments of the present invention.

Figure 5:
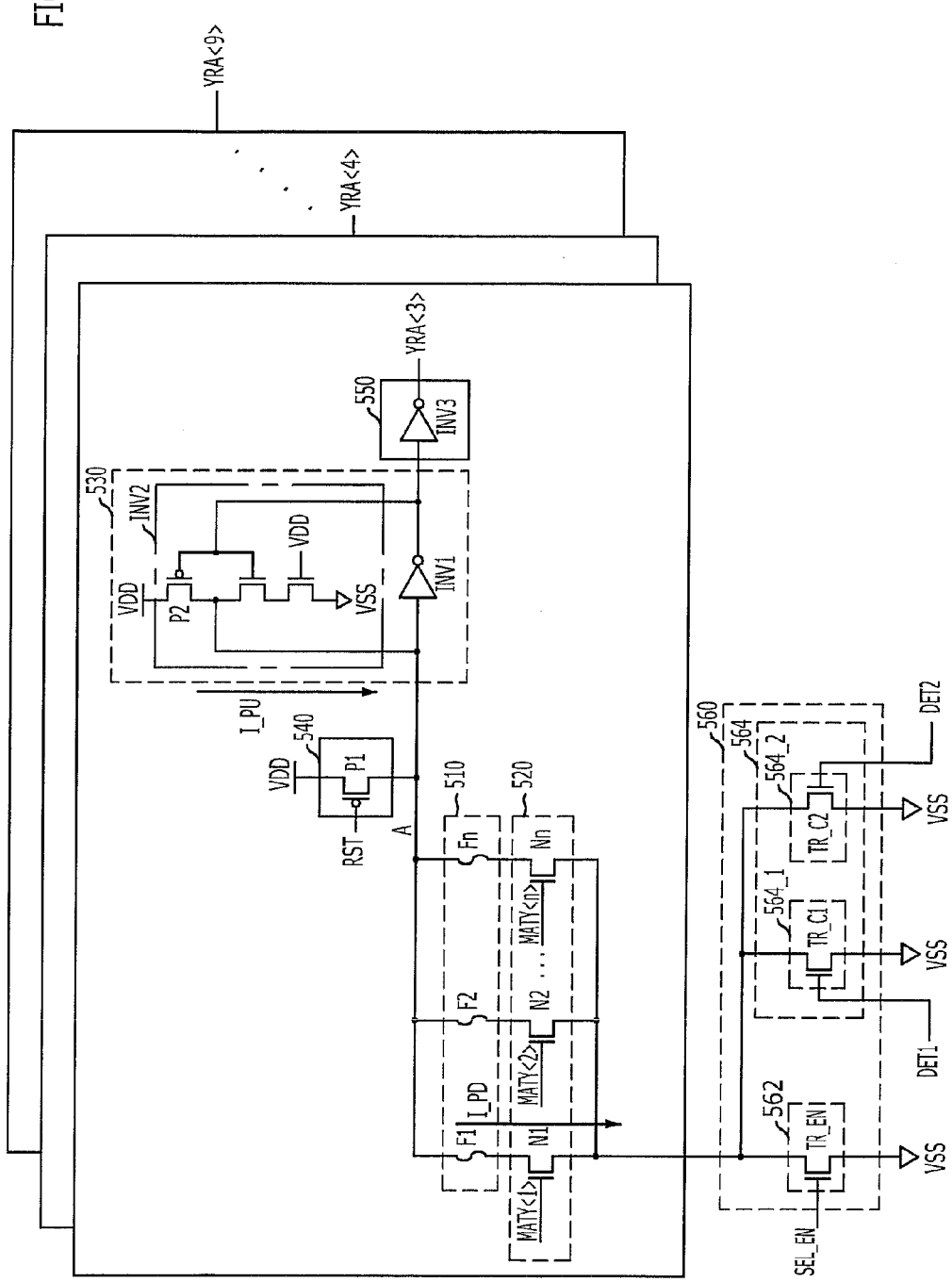
FIG. 5 is a circuit diagram illustrating a plurality of fuse sets 150 in accordance with an embodiment of the present invention.

FIG. 5 is a circuit diagram illustrating a plurality of fuse sets in accordance with an embodiment of the present invention. For ease of description, a fuse set outputting a third redundancy address YRA<3> will be exemplarily described among a plurality of fuse sets.

Referring to FIG. 5, the fuse set includes a plurality of fuses 510, a plurality of selectors 520, a latch unit 530, a precharging unit 540, an output unit 550, and an activation controller 560.

The plurality of fuses 510 program address information corresponding to a target memory cell to be repaired. The plurality of fuses 510 include a node A and first to $n^{th}$ fuses F1, F2, ..., Fn which are connected to the plurality of selectors 520, respectively.

Figure 1:
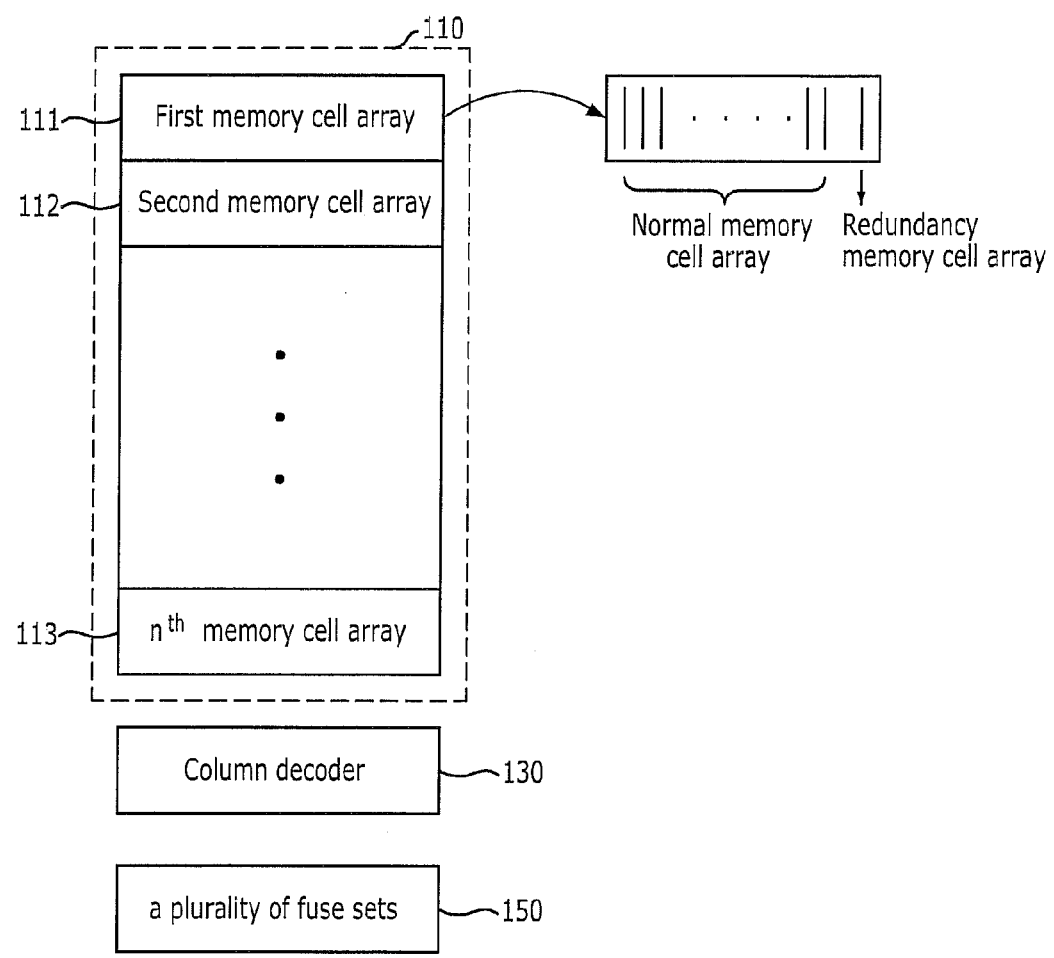
FIG. 1 is a block diagram illustrating a partial structure of a conventional semiconductor memory device.
Figure 2:
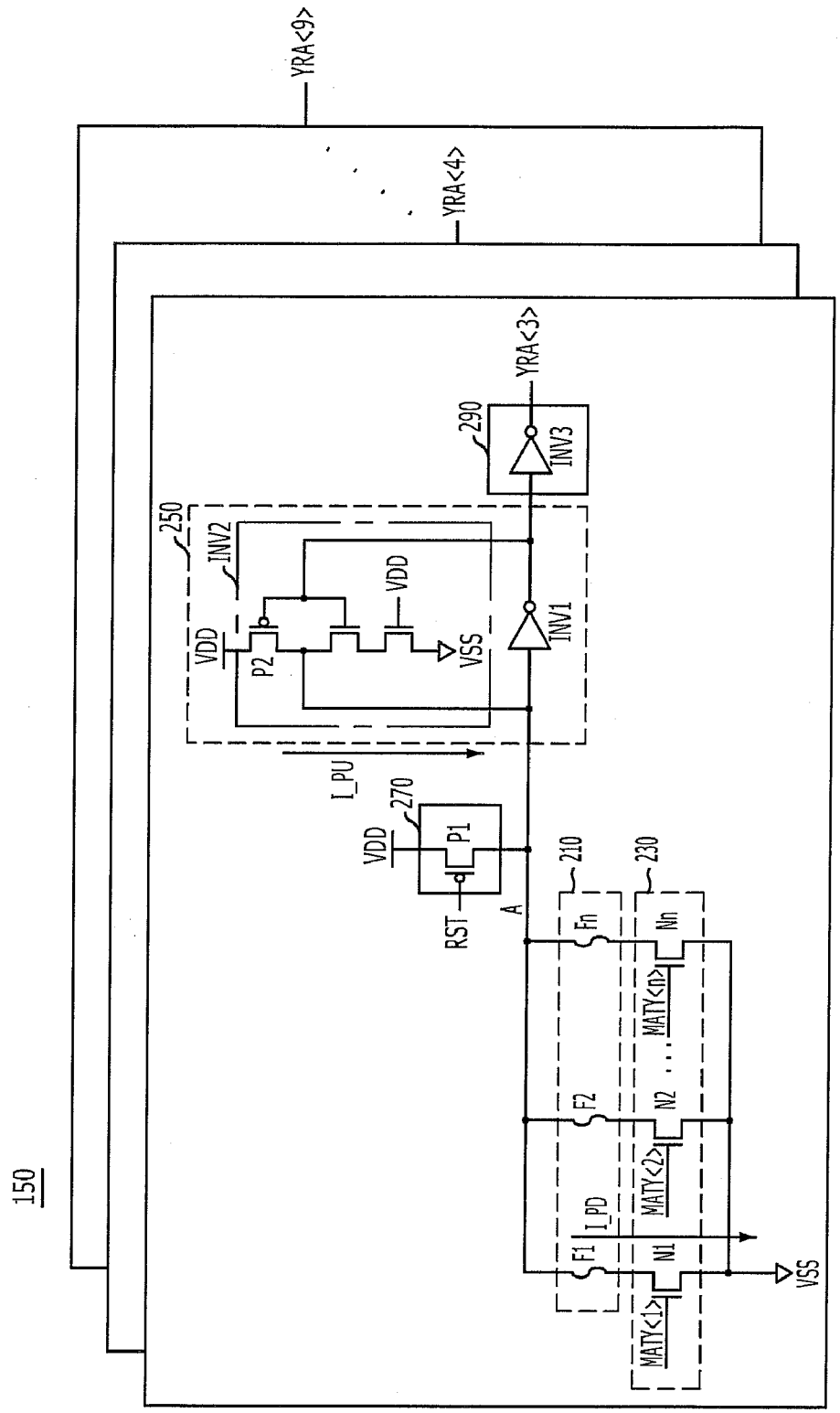
FIG. 2 is a circuit diagram illustrating a plurality of fuse sets 150 of FIG. 1.

The plurality of selectors 520 include first to $n^{th}$ NMOS transistors N1, N2, ..., Nn each of which forms a source-drain path between a corresponding one of first to $n^{th}$ fuses F1, F2, ..., Fn and the activation controller 560 and include a gate receiving a corresponding one of first to $n^{th}$ cell array activation signals MATY<1:n>. The first to $n^{th}$ cell array activation signals MATY<1:N> are signals corresponding to a memory cell array including an activated word line among the first to $N^{th}$ memory cell arrays 111, 112, and 113 (see FIG. 1). The first to $n^{th}$ cell array activation signals MATY<1:N> may be selected corresponding to inputted address information.

The latch unit 530 latches a logical level value according to a programming state of a fuse selected in response to the first to $n^{th}$ cell array activation signals MATY<1:n>. The latch unit 530 includes a first inverter INV1 and a second inverter INV2.

The precharging unit 540 initializes the latch unit 530. The precharging unit 540 includes a first PMOS transistor P1. The first PMOS transistor forms a source-drain path between an external supply voltage VDD terminal and a node A which is an input end of the latch unit 530 and includes a gate receiving a reset signal RST. Here, the reset signal RST is a signal transiting from logical 'low' to logical 'high' when the semiconductor memory device performs an active operation. The first PMOS transistor P1 is turned on before the active operation, and the node A is driven with the external supply voltage VDD.

The output unit 550 receives an output signal of the latch unit 530 and outputs the third redundancy address YRA<3>. The output unit 550 includes a third inverter INV3 for receiving an output signal of the latch unit 530.

The activation controller 560 is connected between the fuse set and the ground supply voltage VSS terminal. Such an activation controller 560 controls whether a corresponding fuse set is activated or not and controls a driving current in response to an activated selection signal SEL_EN and first and second detection signals DET1 and DET2. The activation controller 560 includes an activation unit 562 and a current controller 564. A plurality of activation controllers 560 may be disposed corresponding to the fuse sets, respectively. Also, a plurality of fuse sets are grouped and a plurality of activation units 560 may be disposed to each group.

The activation unit 562 activates a corresponding fuse set in response to an activation selection signal SEL_EN. The activation unit 562 includes an activation transistor TR_EN forming a source-drain path between a plurality of transferring units 520 and a ground supply voltage VSS terminal and including a gate receiving an activation selection signal SEL_EN. Here, the activation selection signal SEL_EN is a signal corresponding to a memory bank activated when the semiconductor memory device operates. The activation unit 562 according to the present embodiment can control whether a corresponding fuse set is activated or not among a plurality of fuse sets corresponding to a memory bank. That is, it means that the semiconductor memory device according to the present embodiment can effectively control power consumption of a plurality of fuse sets corresponding to a memory bank.

The current controller 564 controls a driving current that flows through a current path formed in a corresponding fuse set in response to first and second detection signals DET1 and DET2. The current controller 564 includes a first current controller 564_1 and a second current controller 564_2. Here, the first current controller 564_1 is connected to an activation transistor TR_EN in parallel, connected to a first current control transistor TR_C1 having a gate receiving the first detection signal DET1. The first current controller 654_1 includes a second current control transistor TR_C2 having a gate receiving a second detection signal DET2.

The current controller 564 according to the present embodiment can control a driving current flowing into an activated fuse set in response to the first and second detection signals DET1 and DET2. In order to control the driving current, the first and second detection signals DET1 and DET2 may be signals corresponding to a detection temperature variation according to process characteristics and a supply voltage. Although it is not shown in drawings, it is preferable to further include a detection circuit for generating the first and second detection signals DET1 and DET2 by detecting temperature variation according to the process characteristics and the supply voltage. It is also preferable that an activation region of the first and second detection signals DET1 and DET2 are included in an activation region of the activation selection signal SEL_EN if an activation of a fuse set is controlled corresponding to a plurality of memory banks.

A plurality of fuse sets in a semiconductor memory device according to the present embodiment can output a programmed address of each fuse in response to first to $n^{th}$ cell array activation signals MATY<1:n> as third to ninth redundancy addresses YRA<3:9>. The semiconductor memory device can perform an access operation of a redundancy memory cell using the third to ninth redundancy addresses YRA<3:9>.

Hereinafter, a circuit operation of FIG. 5 will be described with reference to FIG. 3. For ease of description, a fuse set outputting a third redundancy address YRA<3> will be exemplary described. Also, a first fuse F1 will be exemplarily described among a plurality of fuses 510. That is, circuit operations when a first fuse is cut off or when a first fuse is not cut off will be described.

Figure 3:
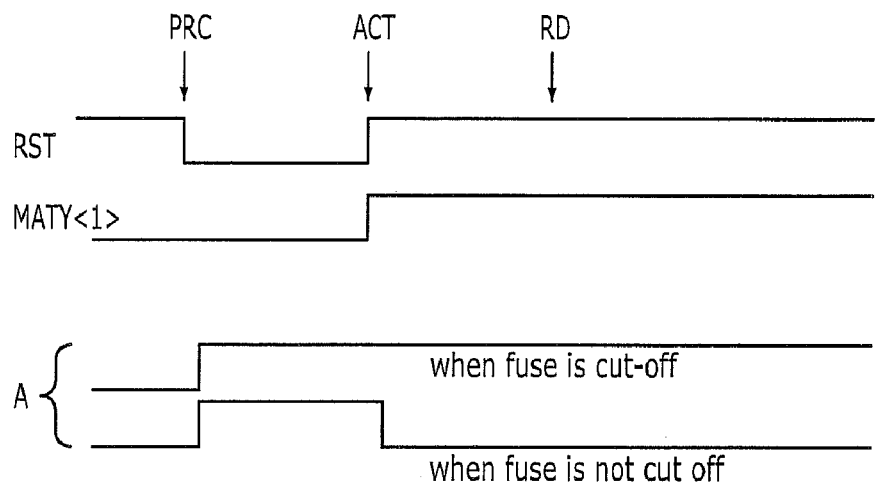
FIG. 3 is a timing diagram describing a circuit operation of a plurality of fuse sets 150 of FIG. 2.
Figure 4:
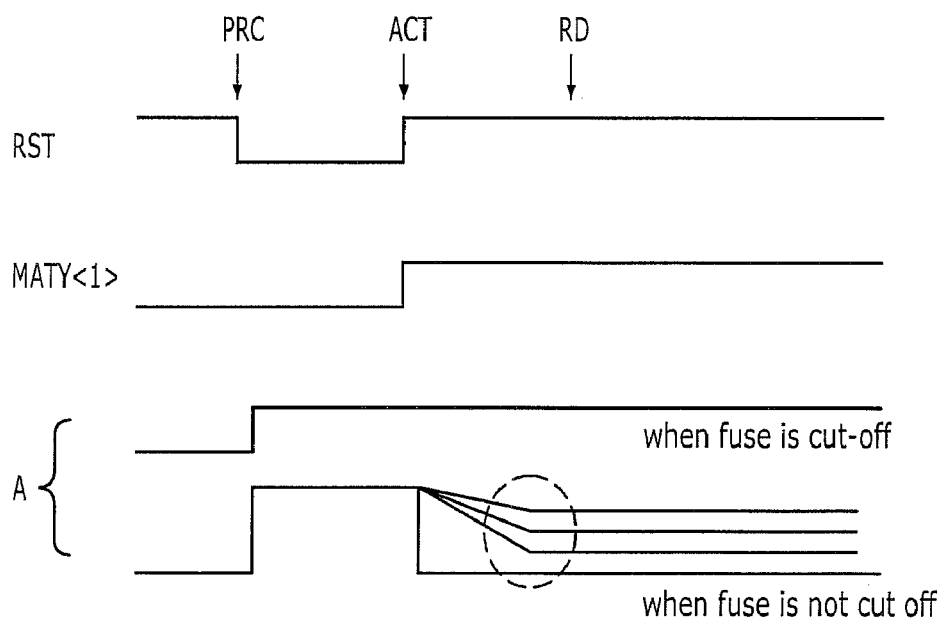
FIG. 4 is a timing diagram describing an error operation of a plurality of fuse sets 150 of FIG. 2.

FIG. 3 is a timing diagram of a circuit operation when a typical semiconductor memory device operation ideally. As described above, the typical semiconductor memory device may have a pull-up driving current I_PU and a pull-down driving current I_PD changed according to process characteristics, supply voltage, and temperature variation. That is, the conventional semiconductor memory device may cause error if a timing diagram of FIG. 4 is applied. However, the semiconductor memory device according to the present embodiment may be applied with the timing diagram of FIG. 3 because the semiconductor memory device according to the present embodiment can control the pull-up driving current I_PU and the pull-down driving current I_PD according to the process characteristics, the supply voltage, and the temperature variation.

At first, a circuitry operation when a first fuse F1 is cut off will be described.

Referring to FIGS. 3 and 5, a reset signal RST transits from logical 'high' to logical 'low' in response to a precharging command PRC. Therefore, the first PMOS transistor PM1 is turned on, and the node A is driven with the external supply voltage VDD. As a result, the latching unit 530 is initialized as logical 'high'. Therefore, when an active command ACT is applied, the reset signal RST transits from logical 'low' to logical 'high'. Here, the first PMOS transistor P1 is turned off and the node A sustains logical 'high by the second inverter INV2 of the latching unit 530. The first cell array activation signal MATY<1> is activated from logical 'low' to logical 'high' in response to the active command ACT. The node A sustains logical 'high' because the first fuse F1 is cut off although the first NMOS transistor N1 is turned on.

Hereinafter, a circuit operation when the first fuse F1 is not cut off will be described. Since a circuit operation before receiving the active command ACT is identical to that performed when the first fuse F1 is cut off, the detail description thereof is omitted. Here, the first NMOS transistor N1 is turned on, and the node A transits from logical 'high' to logical 'low' because the first fuse F1 is not cut off.

FIG. 3 is a timing diagram illustrating a circuit operation of a fuse set in accordance with an embodiment of the present invention. A logical level of the third redundancy address YRA<3> may be decided according to whether the first fuse F1 is cut off or not. That is, the third redundancy address YRA<3> becomes logical 'high' when the first fuse F1 is cut off, and the third redundancy address YRA<3> becomes logical low when the first fuse F1 is not cut off. Such a third redundancy address YRA<3> is compared with an address applied corresponding to a read command RD, and a semiconductor memory device provides information for determining whether a redundancy memory cell is accessed or not according to the comparison result.

Meanwhile, the node A sustains logical 'high' when the first fuse F1 is cut off. Then, the node A forms not only a pull-up current path but also a pull-down current path when the first fuse F1 is not cut off. That is, the node A sustains logical 'low' despite the opposition of the pull down driving current I_PD flowing through the pull-down current path and the pull up driving current I_PU. Here, the current controller 564 compensates the variation of the pull-up driving current I_PU and the pull-down driving current I_PD although the pull-up driving current I_PU and the pull-down driving current I_PD are changed according to the process characteristics, supply voltage, and temperature variation.

For ease of description, it is assumed that the activation transistor TR_EN is turned on by the activated activation selection signal SEL_EN. Other fuse sets corresponding to other memory banks may be inactivated. In this condition, if the pull-up driving current I_PU is excessive, the first and second detection signals DET1 and DET2 are activated and the first and second current control transistors TR_C1 and TR_C2 are turned on, thereby making the pull down driving current I_PD to be larger by an amount corresponding to the excess pull-up driving current I_PU. That is, the semiconductor memory device according to the present embodiment can control the pull down driving current I_PD to be larger using the first and second detection signals DET1 and DET2 although the pull-up driving current I_PU becomes excessive according to the process characteristic, the supply voltage, and the temperature variation. Therefore, it is possible to drive the node A with the ground supply voltage VSS. Due to the node A driven by the ground supply voltage VSS, the third redundancy address YPA<3> becomes logical 'low'.

If the pull-up driving current I_PU gradually decreases, it is also possible to decrease the pull-down driving current I_PD by an amount corresponding to the decrement of the pull-up driving current I_PU by controlling the activation of the first and second current control transistors TR_C1 and TR_C2. The number of the first and second current control transistors TR_C1 and TR_C2 may differ according to design. Also, the number of control signals controlling the transistors may differ according to designs. The first and second detection signals DET1 and DET2 may have not only logical levels but may also be varied in analog. In this case, it is preferable that the number and the type of the first and second current control transistors TR_C1 and TR_C2 are designed corresponding the first and second detection signals DET1 and DET2 with each having an analog value.

Since a driving current has an abnormal state according to the process characteristics, the supply voltage, and the temperature variation in case of a conventional semiconductor memory device, the conventional semiconductor memory device cannot reflect a programming state of a fuse into the redundancy address. However, the semiconductor memory device according to the present embodiment can output a desired redundancy address according to the programming state of the fuse because the semiconductor memory device according to the present embodiment controls the driving current flowing into the current path according to the process characteristic, the supply voltage, and the temperature variation.

As described above, the plurality of fuse sets according to the present embodiment effectively consume electric power by controlling whether a plurality of fuse sets are activated or not according to the activation of the plurality of fuse sets included in a plurality of memory banks. Therefore, the semiconductor memory device according to the present embodiment may minimize power consumption. Also, the semiconductor memory device according to the present embodiment may stably access a redundancy memory cell in steady of a target memory to be repaired when the semiconductor memory device according to the present embodiment accesses a target memory cell to be repaired by outputting a redundancy address corresponding to the programming state of the fuse. Therefore, the reliability of the semiconductor memory device is improved.

Embodiments of the present invention relate to a semiconductor memory device for improving the reliability thereof by outputting a predetermined redundancy address according to the programming state of a fuse although the process characteristics, the supply voltage, and the temperature may change.

The plurality of fuse sets effectively control power consumption by controlling the activation of the plurality of fuse sets according to a plurality of memory banks. Therefore, it is possible to minimize power consumption of a semiconductor memory device.

While the present invention has been described with respect to the specific embodiments, it will be apparent to those skilled in the art that various changes and modifications may be made without departing from the spirit and scope of the invention as defined in the following claims.

The embodiments of the present invention were described to include a plurality of fuse sets corresponding to each of a plurality of memory banks. However, the present invention may be identically applied to control the activation of a plurality of fuse sets having different operation timings although it corresponds to the same memory banks. The embodiments of the present invention were described to include the activation controller 560 connected to the ground supply voltage VSS terminal. However, the present invention will be identically applied to control the activation of a plurality of fuse sets having different operation timings although the activation controller 560 according to the present embodiment is connected to the external supply voltage VDD or the other supply voltage. Although the redundancy operation and the circuit structure for the column addresses were described, the present invention may be identically applied for a row address.

Further, locations and types of logical gates and transistors in the embodiments of the present invention may be embodied differently according to a polarity of an input signal.

What is claimed is:

1. A semiconductor memory device, comprising:
    a fuse set configured to form a current path including at least one of a plurality of fuses in response to address information corresponding to a plurality of memory cells and to output a redundancy address corresponding to a programming state of the plurality of fuses where the plurality of fuses are programmed with address information corresponding to a target memory cell to be repaired among the plurality of memory cells; and
    at least one current controlling unit configured to control a driving current flowing through the current path according to at least one detection signal, wherein the at least one detection signal has a predetermined control value corresponding to at least one of process characteristics, supply voltage, and temperature variation.

2. The semiconductor memory device of claim 1, wherein the at least one detection signal includes a plurality of detection signals, and
    wherein the at least one current controlling unit includes a plurality of current controllers that are activated in response to the plurality of detection signals.

3. The semiconductor memory device of claim 1, wherein the at least one current controlling unit is connected between the fuse set and a supply voltage terminal.

4. The semiconductor memory device of claim 1, wherein the fuse set includes:
    the plurality of fuses configured to program the address information corresponding to the target memory cell;
    a plurality of selectors configured to select the plurality of fuses in response to an activation signal;
    a latching unit configured to latch the redundancy address outputted corresponding to a programming state of a selected fuse; and
    a precharging unit configured to initialize the latching unit.

5. The semiconductor memory device of claim 4, wherein the activation signal is activated for a memory cell array including the plurality of memory cells.

6. The semiconductor memory device of claim 1, further comprising a detector configured to generate the detection signal in response to at least one of process characteristics, supply voltage, and temperature variation.

7. A semiconductor memory device, comprising:
    a plurality of fuse sets configured to output a plurality of redundancy addresses according to a programming state of a plurality of fuses in response to address information corresponding to a plurality of memory cells in each memory bank and corresponding to a plurality of memory banks where the plurality of fuses are programmed with address information corresponding to a target memory cell to be repaired among the plurality of memory cells; and at least one activation controlling unit configured to control activation of the plurality of fuse sets in response to a selection signal corresponding to the memory bank, wherein each of the plurality of fuse sets includes:
- the plurality of fuses configured to program the address information corresponding to the target memory cell:
- a plurality of selectors configured to form a current path including one of the plurality of fuses in response to an activation signal;
- a latching unit configured to latch a redundancy address outputted corresponding to a programming state of a selected fuse; and
- a precharging unit configured to initialize the latching unit, wherein the activation signal is activated for a selected memory cell array including the plurality of memory cells, wherein the at least one activation controlling unit includes:
- an activator configured to activate a corresponding fuse set in response to the selection signal; and
- at least one current controller configured to control a driving current flowing through a current path according to at least one detection signal, wherein the at least one detection signal has a predetermined control value corresponding to process characteristics, supply voltage, and temperature variation.

8. The semiconductor memory device of claim 7, wherein a number of the at least one activation controlling unit corresponds to a grouped fuse sets or each fuse set.

9. The semiconductor memory device of claim 7, wherein the at least one current controller is connected between the plurality of fuse sets and a supply voltage terminal.

10. The semiconductor memory device of claim 7, wherein the at least one detection signal includes a plurality of detection signals, and wherein the at least one current controller includes a plurality of current controllers activated in response to the plurality of detection signals.

11. The semiconductor memory device of claim 7, further comprising: a detector configured to generate the detection signal in response to at least one of process characteristics, supply voltage, and temperature variation.

12. A method comprising:
- forming a current path including at least one of a plurality of fuses in response to address information corresponding to a plurality of memory cells;
- outputting a redundancy address corresponding to a programming state of the plurality of fuses where the plurality of fuses are programmed with address information corresponding to a target memory cell to be repaired among the plurality of memory cells; and
- selectively turning on a plurality of transistors connected to the current path to drain current through the current path, wherein a number of the transistors that are turned on changes based on at least one detection signal and the at least one detection signal is determined based on at least one of process characteristics, supply voltage, and temperature variation.

13. The method of claim 12, wherein the drain current changes a logic state of a latch circuit.

* * * * *

UNITED STATES PATENT AND TRADEMARK OFFICE
CERTIFICATE OF CORRECTION

| | | |
|---|---|---|
| PATENT NO. | : 8,023,354 B2 | Page 1 of 1 |
| APPLICATION NO. | : 12/486784 | |
| DATED | : September 20, 2011 | |
| INVENTOR(S) | : Young-Han Jeong | |

It is certified that error appears in the above-identified patent and that said Letters Patent is hereby corrected as shown below:

Change Title of Invention portion of section (54) and Col. 1, lines 1-3 as follows:

(54)　　SEMICONDUCTOR MEMORY DEVICE

Signed and Sealed this
First Day of November, 2011

David J. Kappos
*Director of the United States Patent and Trademark Office*